United States Patent
Oh et al.

(10) Patent No.: US 7,236,894 B2
(45) Date of Patent: Jun. 26, 2007

(54) CIRCUITS, SYSTEMS AND METHODS FOR DYNAMIC REFERENCE VOLTAGE CALIBRATION

(75) Inventors: Kyung Suk Oh, Campbell, CA (US); Frank Lambrecht, Mountain View, CA (US); David Nguyen, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/021,598

(22) Filed: Dec. 23, 2004

(65) Prior Publication Data

US 2006/0142977 A1 Jun. 29, 2006

(51) Int. Cl.
*G11C 7/14* (2006.01)

(52) U.S. Cl. .................. 702/57; 702/64; 702/80; 702/107; 365/189.09

(58) Field of Classification Search .............. 702/57, 702/64, 65, 80, 107, 186, 188, 189
See application file for complete search history.

(56) References Cited

U.S. PATENT DOCUMENTS

| | | | |
|---|---|---|---|
| 4,604,732 A | 8/1986 | van Tran | 365/207 |
| 5,426,616 A | 6/1995 | Kajigaya et al. | 365/226 |
| 5,999,021 A | 12/1999 | Jang | 327/47 |
| 6,040,735 A * | 3/2000 | Park et al. | 327/541 |
| 6,118,265 A | 9/2000 | Larsen et al. | 327/316 |
| 6,154,065 A | 11/2000 | Komatsu | 327/56 |
| 6,229,383 B1 | 5/2001 | Ooishi | 327/540 |
| 6,239,652 B1 | 5/2001 | Oh et al. | 327/541 |
| 6,288,954 B1 | 9/2001 | Manning | 365/201 |
| 6,546,343 B1 | 4/2003 | Batra et al. | 702/64 |
| 6,643,787 B1 | 11/2003 | Zerbe et al. | 713/400 |
| 6,646,911 B2 * | 11/2003 | Hidaka | 365/173 |
| 6,684,263 B2 | 1/2004 | Horowitz et al. | 710/8 |
| 6,707,724 B2 | 3/2004 | Kim et al. | 365/189.09 |
| 6,826,103 B2 * | 11/2004 | Moon et al. | 365/210 |
| 6,876,585 B2 | 4/2005 | Choi et al. | 365/189.09 |
| 6,882,593 B2 * | 4/2005 | Best et al. | 365/233 |
| 6,885,959 B2 * | 4/2005 | Salmon et al. | 702/107 |
| 6,940,777 B2 * | 9/2005 | Ooishi | 365/226 |
| 2001/0014049 A1 | 8/2001 | Woo et al. | 365/211 |
| 2003/0151450 A1 | 8/2003 | Nguyen et al. | 327/540 |

* cited by examiner

*Primary Examiner*—Hal Wachsman
(74) *Attorney, Agent, or Firm*—Vierra Magen Marcus & DeNiro LLP (57) ABSTRACT

A circuit, system and method adjusts a reference voltage, such as an internal or external reference voltage $V_{REF}$, in response to a first voltage at a first contact, such as a pin on a memory controller used for reading or writing data, and a second voltage at a second contact in embodiments. Logic is coupled to the first and second contacts to provide a control signal in response to the first and second voltages. A comparator provides an input signal to the logic in response to a target reference voltage and the reference voltage during a calibration or initialization mode of operation. In an alternate embodiment, a plurality of data values at a first contact are compared to a predetermined plurality of test data. An up/down signal is then provided to a counter and a register stores a counter value used to provide a reference voltage.

23 Claims, 11 Drawing Sheets

CIRCUITS, SYSTEMS AND METHODS FOR DYNAMIC REFERENCE VOLTAGE CALIBRATION

FIELD OF THE INVENTION

The present invention relates to high speed signaling.

BACKGROUND OF THE RELATED ART

In high speed signaling, a single-ended signal is typically transferred on a single signal line by using a fixed reference voltage as a reference, such as a $V_{REF}$ voltage, that has an approximate fixed level or value at devices transferring and receiving the varying single-ended signal. However, a reference voltage generally does not track variations that may occur when providing signals, to a device, such as an integrated circuit memory device. For example, voltage sources may be noisy or provide a voltage level that is non-ideal and thus provide a reference voltage that is non-ideal. Termination values in a channel or device may change under various configurations or environmental conditions. Also, a reference voltage should take into account the overall channel effect, such as the length of the channel, when transferring signals.

Furthermore, as signal transfer rates increase in frequency and signal voltage swings are decreased, an erroneous bit value may be obtained when sampling voltage values because a reference voltage value is not adjusted to take into account the resulting smaller voltage difference between a high voltage value (or high logic value) and the non-ideal low voltage value (or low logic value).

If these variations and increases in signal frequencies are not taken into account, a non-ideal reference voltage may result in the reduction of system operating performance.

BRIEF DESCRIPTION OF THE DRAWING

The present invention is illustrated by way of example, and not by way of limitation, in the figures of the accompanying drawings and in which like reference numerals refer to similar elements in which:

FIG. 2b illustrates an up/down register embodiment shown in FIG. 2a.

DETAILED DESCRIPTION

Circuits, system and method, in various embodiments, adjust a reference voltage, such as an internal or external reference voltage $V_{REF}$, in response to a first voltage value at a first contact, such as a pin on a memory controller and a second voltage value at a second contact. Logic is coupled to the first and second contacts to provide a control signal in response to the first and second voltage values. A comparator provides an input signal to the logic in response to a target reference voltage value and the reference voltage value during a calibration or initialization mode of operation. In an alternate embodiment, a plurality of data values at a first contact are compared to a predetermined plurality of test data. Up/down signals are then provided to a counter and a register stores a counter value used to provide a reference voltage. In a further embodiment, a system, in particular a memory controller, provides a plurality of values representing internal reference voltages for a plurality of grouped integrated circuit memory devices during respective read operations.

Figure 1:
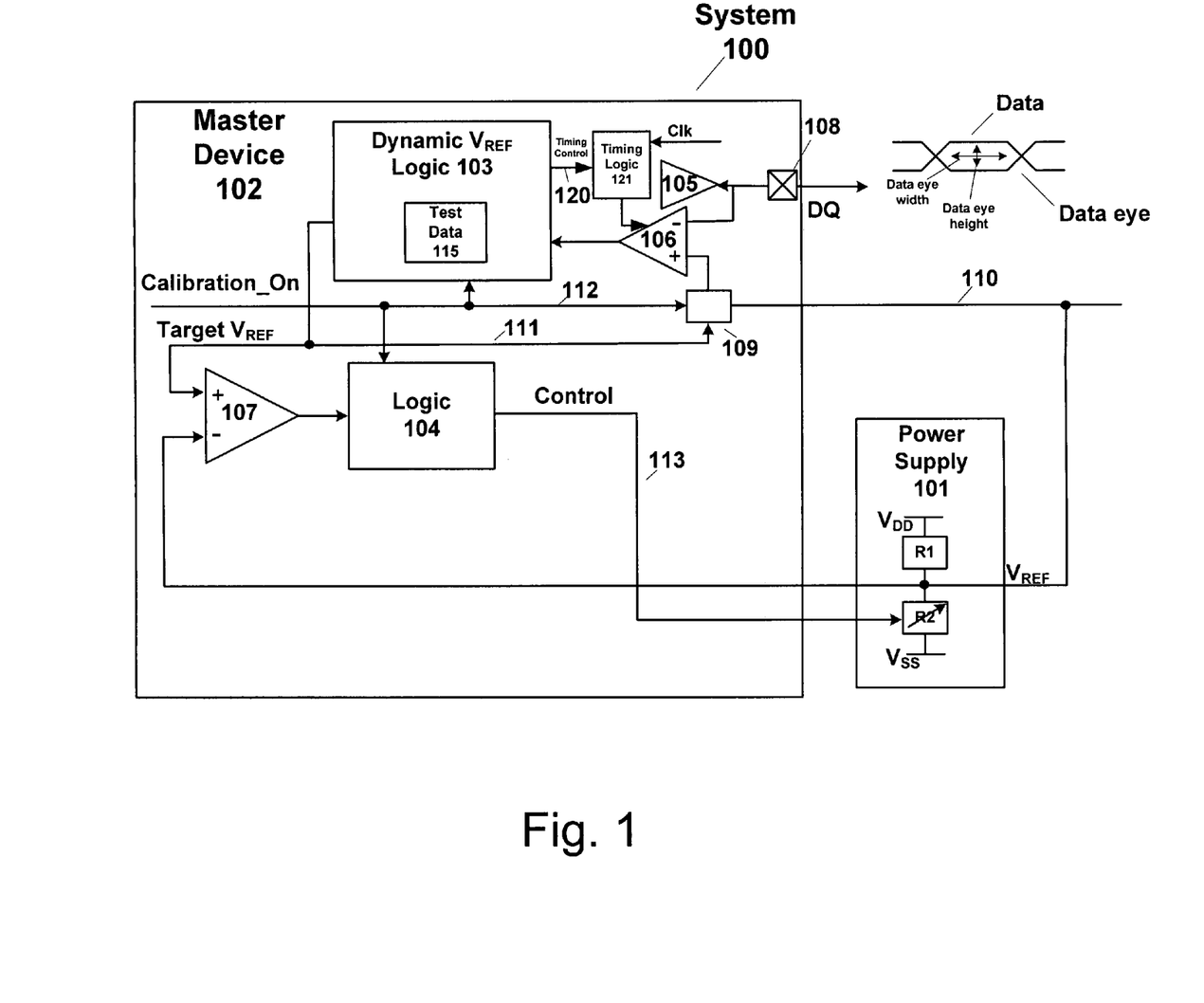
FIG. 1 illustrates a system 100 for adjusting a reference voltage $V_{REF}$ using a predetermined plurality of test data for a write operation according to an embodiment.

FIG. 1 illustrates a system 100 including a master device 102 and power supply 101 for adjusting an external reference voltage $V_{REF}$ on signal line 110 for a write operation. In alternate embodiments, master device 102 is a memory controller, general-purpose processor, graphics processor, set-top box processor, game console processor, television processor or an equivalent. In embodiments, power supply 101 is a separate integrated circuit device as illustrated in FIG. 1 or included in other system 100 circuit devices, such as master device 102.

Figure 6:
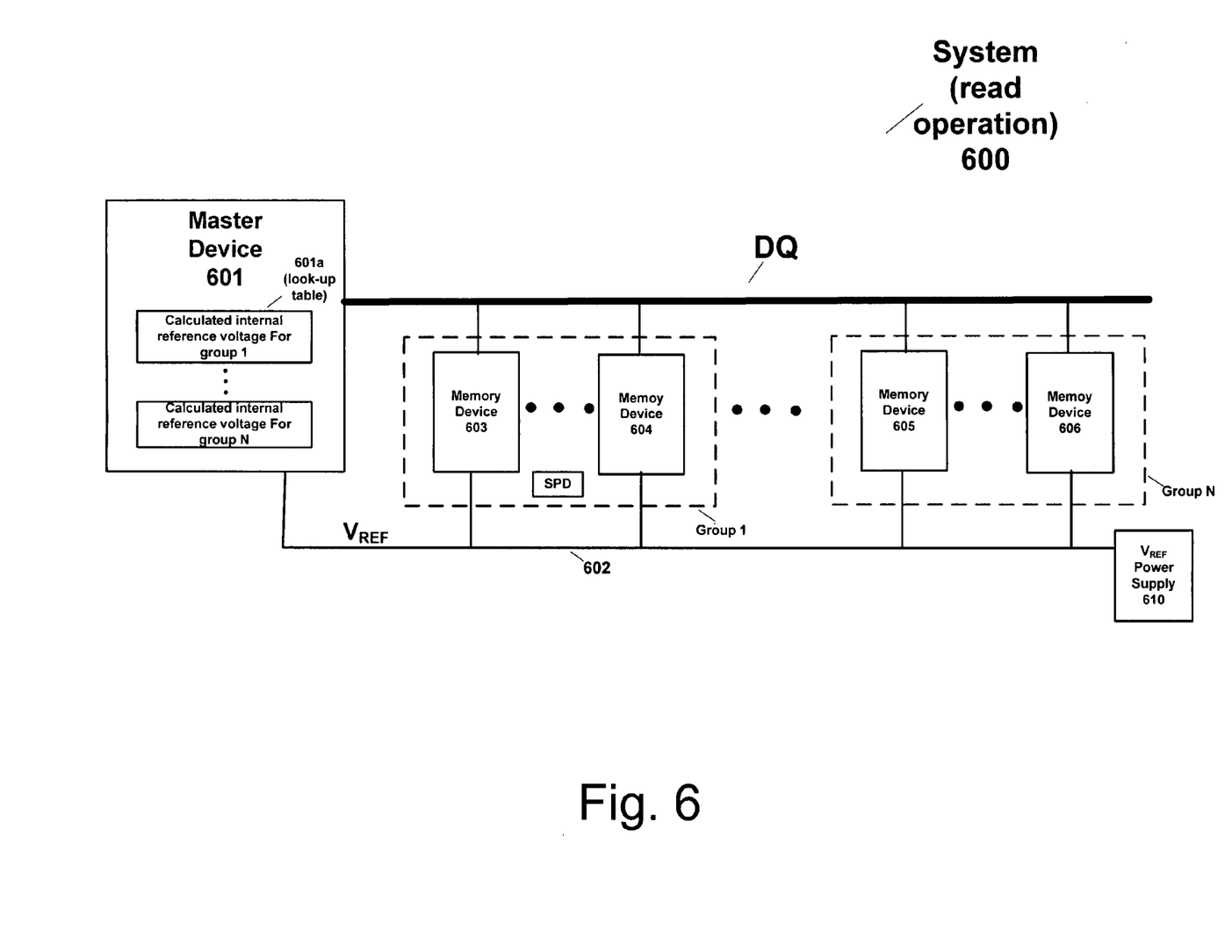
FIG. 6 illustrates a memory system 600 for using a plurality of respective calculated internal reference voltages $V_{REF}$ for respective groups of integrated circuit memory devices in respective read operations according to an embodiment.

A contact 108 is used to transmit and/or receive signals to or from one or more integrated circuit devices, such as between master device 102 and an integrated circuit memory device 603 as seen in FIG. 6. Contact 108 is one of many contacts in an embodiment. Contact 108 is coupled to integrated circuit memory devices by way of an interconnect DQ. In an embodiment of the present invention, contact 108 includes a surface, pin, wire lead or solder ball, singly or in combination, to provide electrical connections between master device 102 and interconnect DQ. In an embodiment of the present invention, master device 102 is coupled to a printed circuit board or card including a plurality of signal lines or traces that may be used as interconnect DQ or as a part of interconnect DQ.

In an embodiment of the present invention, an interconnect, such as interconnect DQ, between or within devices is represented as a single signal line in the figures and represents a conductive element, wire or trace for transferring a signal between or within a device. In an alternate embodiment of the present invention, a single signal line between or within a device shown in the figures represents multiple interconnections, signal lines or a bus. In an embodiment, interconnect DQ is a bidirectional bus in which signals can transfer in different directions on a single signal line. In an alternate embodiment, interconnect DQ is a unidirectional bus in which signals can transfer in only one direction on a single signal line. In still a further embodiment, interconnect DQ is a combination of unidirectional and bidirectional buses.

Signals described herein may be transmitted or received between and within devices by electrical conductors and generated using any number of signaling techniques including without limitation, modulating the voltage or current level of an electrical signal. The signals may represent any type of control and timing information (e.g. commands, address values, clock signals, and configuration information) as well as data. Also, a single signal illustrated may represent a plurality of signals on respective signal lines in an embodiment of the present invention. Also, signals such as reference voltage $V_{REF}$ represent a voltage level or value.

Power supply 101 includes two voltage sources $V_{DD}$ and $V_{SS}$. In an embodiment, voltage source $V_{DD}$ is a high potential voltage source and $V_{SS}$ is a low potential voltage source (as compared to voltage source $V_{DD}$) or ground potential source. In an embodiment, a resistor R1 having a fixed resistance value is coupled in series between voltage source $V_{DD}$ and signal line 110. In an alternate embodiment, resistor R1 is a variable resistor having a predetermined resistance value in response to a control signal on signal line 113. In an embodiment, a control signal on signal line 113 is a control voltage value or control word representing a desired resistance value of variable resistor R2. In an embodiment, resistor R2 is a variable resistor, coupled in series between voltage source $V_{SS}$ and signal line 110, having a predetermined resistance value in response to a control signal on signal line 113.

Master device 102 includes a transmitter 105 and receiver 106 coupled to contact 108. In alternate embodiments, multiple transmitters and receivers are coupled to multiple contacts. Transmitter 105 transmits signals on contact 108 and interconnect DQ. Receiver 106 receives signals on contact 108 from interconnect DQ at a first input and a reference voltage $V_{REF}$ at a second input from signal line 110 when switch 109 is deactivated. Switch 109 is activated in response to a Calibration_On signal provided on signal line 112 to Dynamic $V_{REF}$ logic 103, logic 104 and switch 109. When switch 109 is activated, Dynamic $V_{REF}$ logic 103 provides a Target reference voltage $V_{REF}$ to a second input of receiver 106 (by way of switch 109). In an embodiment, switch 109 is not located on master device 102.

A Calibration_On signal is generated in response to a system 100 operating in a $V_{REF}$ calibration or initialization mode. A Calibration_On signal is generated during a power-up of system 100 or during a periodic $V_{REF}$ calibration mode determined by master device 102. In an embodiment, a Calibration_On signal is provided from a register, or a bit value in a register, at system 100 initialization or power-up. In an embodiment, a programmable logic device (PLD) generates a Calibration_On signal. The PLD device stores information used by system 100 to properly configure system 100. In an embodiment, system 100 reads information from a non-volatile device (EEPROM) and writes the information to a register positioned on master device 102 to store a value that represents a desired mode. The register that stores the value can be used to generate a Calibration_On signal.

In an embodiment, master device 102 generates a Calibration_On signal in response to the execution of machine-readable instructions or software stored on or accessible to master device 102.

During a $V_{REF}$ calibration mode, a reference voltage $V_{REF}$ is adjusted to a Target reference voltage $V_{REF}$ output by Dynamic $V_{REF}$ logic 103 to comparator 107 and switch 109. Dynamic $V_{REF}$ logic 103 determines a Target reference voltage $V_{REF}$ responsive to comparing a plurality of received data signals at contact 108 with a predetermined plurality of test data 115 stored in Dynamic $V_{REF}$ logic 103. In an embodiment, Dynamic $V_{REF}$ logic 103 sets a Target reference voltage $V_{REF}$ to increase a received data eye height which typically is at an approximate center of a data eye. To compute a data eye height, a Target reference voltage $V_{REF}$ value is first swept (or adjusted in increments across the date eye) to find data eye boundaries (width and height) where the received data are incorrectly interpreted. In an embodiment, Dynamic $V_{REF}$ logic 103 includes logic to calculate a data eye width and/or height and sets a Target reference voltage $V_{REF}$ to improve a data eye width and/or height at a selected reference voltage $V_{REF}$ level.

In an embodiment, the predetermined plurality of test data 115 is a psuedo random bit sequence (PRBS) or predetermined pattern of data.

In an embodiment, the plurality of test data 115 is transmitted by transmitter 105 and directly provided to receiver 106. In a further embodiment, the received data signals may be test data written to an integrated circuit memory device and then read back by master device 102. In still a further embodiment, the received data signals are generated by an identical stored predetermined plurality of test data 115 stored in an integrated circuit memory device, such as integrated circuit memory device 603 shown in FIG. 6 that is read by master device 102.

A control signal is output by logic 104 on signal line 113 to set the resistance value of variable resistor R2 necessary to adjust a reference voltage $V_{REF}$ to a calibrated value or level corresponding to Target reference voltage $V_{REF}$. Comparator 107 provides an input signal (or a difference signal in an embodiment) to logic 104 in response to a comparison of Target reference voltage $V_{REF}$ provided by Dynamic $V_{REF}$ logic 103 on signal line 111 and reference voltage $V_{REF}$ on signal line 110.

In embodiments, separate reference voltages $V_{REF}$ are calculated and provided for individual read/write contacts or groups of contacts.

In an embodiment, Dynamic $V_{REF}$ logic 103 also outputs a timing control signal on signal line 120 to adjust a timing logic 121. In embodiments, external and/or internal clock signals (Clk) are input to timing logic 121. In embodiments, clock signals Clk are timing reference signals that may include clock or strobe signals used for obtaining data values at contact 108. Timing logic 121 then adjusts Clk signals in response to a timing control signal and provides adjusted clock signals to a receiver 106 for obtaining or sampling data values from contact 108. In an embodiment, timing logic 121 and one or more timing control signals are used to sweep a data eye or obtain the boundaries of a data eye by incrementing or decrementing the phase of Clk signals that are then provided to receiver 106.

Figure 2A:
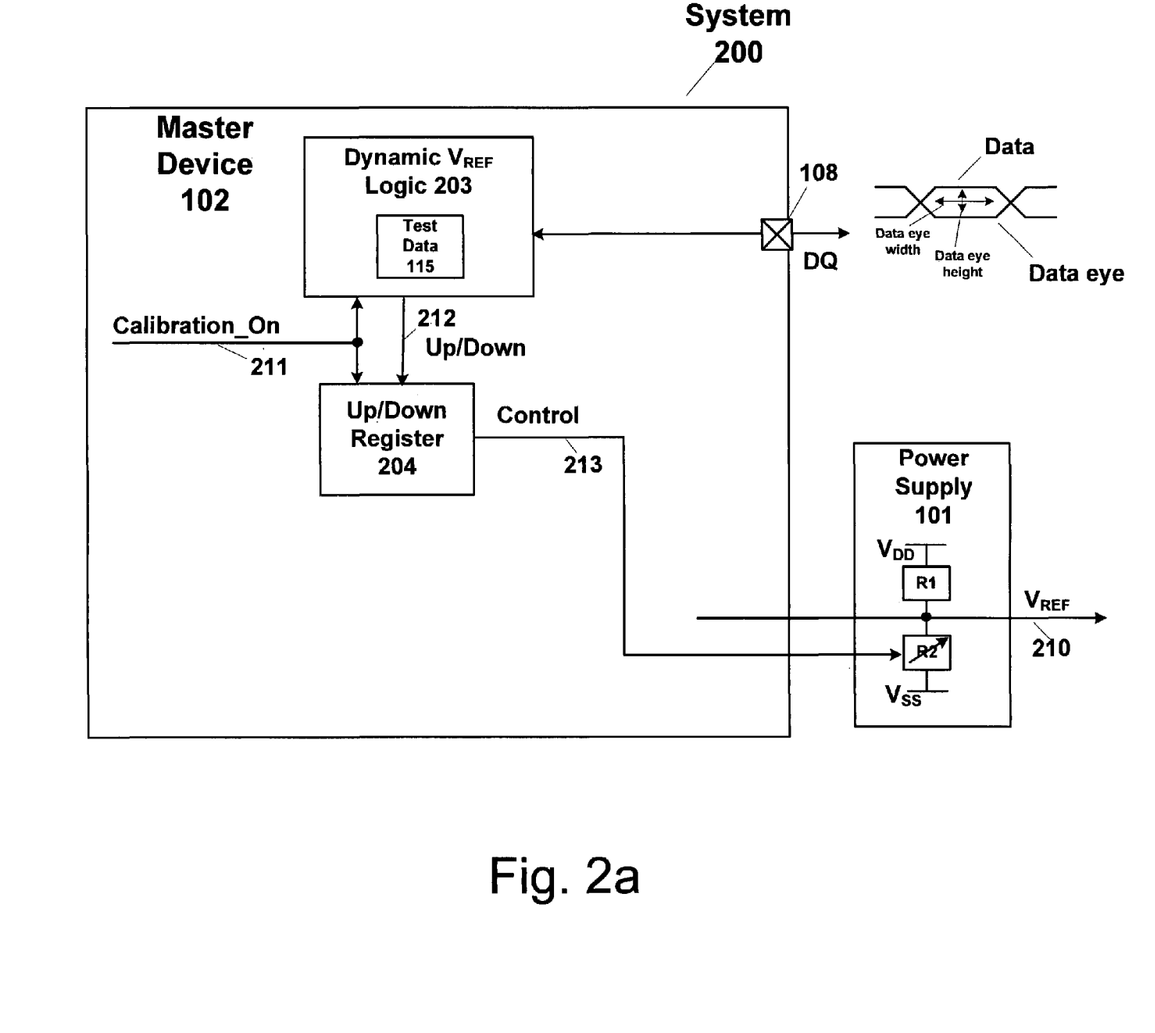
FIG. 2a illustrates a system 200 for adjusting a reference voltage $V_{REF}$ using a predetermined plurality of test data for a write operation according to another embodiment.

FIG. 2a illustrates a system 200 including a master device 102 and a power supply 101 for adjusting an external reference voltage $V_{REF}$ on signal line 210 for a write or transmit operation. System 200 is similar to system 100 shown in FIG. 1. A contact 108 is used to transmit and/or receive signals to or from one or more integrated circuit devices, such as between master device 102 and an integrated circuit memory device 603 as seen in FIG. 6. Contact 108 is coupled to integrated circuit memory devices by way of an interconnect DQ. In an embodiment, interconnect DQ is used to transfer only data and a separate interconnect is used to transfer control information, such as address information for an integrated circuit memory device.

In an embodiment, separate reference voltages $V_{REF}$ are provided for interconnect DQ and another interconnect used for control information. For example, a reference voltage $V_{REF}$ on signal line 210 is used for interconnect DQ and a different reference voltage $V_{REF}$ on a separate signal line is used for an interconnect used for control information. In an embodiment, a reference voltage $V_{REF}$ used for control information is adjusted similarly to a reference voltage $V_{REF}$ used for data information on interconnect DQ.

A Calibration_On signal, similar to system 100, is generated on signal line 211 in response to a system 200 operating in a $V_{REF}$ calibration or initialization mode. A Calibration_On signal is generated during a power-up of system 200 or during a periodic $V_{REF}$ calibration mode determined by master device 102 as described above. Dynamic $V_{REF}$ logic 203 outputs an up or down signal (or an adjustment signal) on signal line 212 responsive to comparing a plurality of received data signals at contact 108 with a predetermined plurality of test data 115 stored in Dynamic $V_{REF}$ logic 203. In an embodiment, Dynamic $V_{REF}$ logic 203 sets a Target reference voltage $V_{REF}$ to increase a received data eye height, which typically is at an approximate center of a data eye. To compute a data eye height, a Target reference voltage $V_{REF}$ value is first swept (or adjusted in increments across the date eye) to find data eye boundaries (width and/or height) where the received data is incorrectly interpreted. In an embodiment, Dynamic $V_{REF}$ logic 203 includes logic to calculate a data eye width and/or height and sets a Target reference voltage $V_{REF}$ to improve the data eye width and/or height at a selected reference voltage $V_{REF}$ level.

In an embodiment, the predetermined plurality of test data 115 is a psuedo random bit sequence (PRBS) or a predetermined pattern of data.

In an embodiment, the plurality of test data 115 is compared directly with data transmitted on contact 108. In an embodiment, master device 102 includes a transmitter and receiver coupled to contact 108. In a further embodiment, the received data signals may be test data written to an integrated circuit memory device and then read back by master device 102. In still a further embodiment, the received data signals are generated by an identical stored predetermined plurality of test data 115 stored in an integrated circuit memory device, such as integrated circuit memory device 603 shown in FIG. 6 that is read by master device 102.

Power supply 101 includes two voltage sources $V_{DD}$ and $V_{SS}$ and resistor R1 and variable resistor R2 coupled to signal line 210 as described above in regard to system 100. A control signal is output by up/down register 204 to set the resistance value of variable resistor R2 necessary to adjust a reference voltage $V_{REF}$ to a calibrated value or level on signal line 210.

Figure 2B:
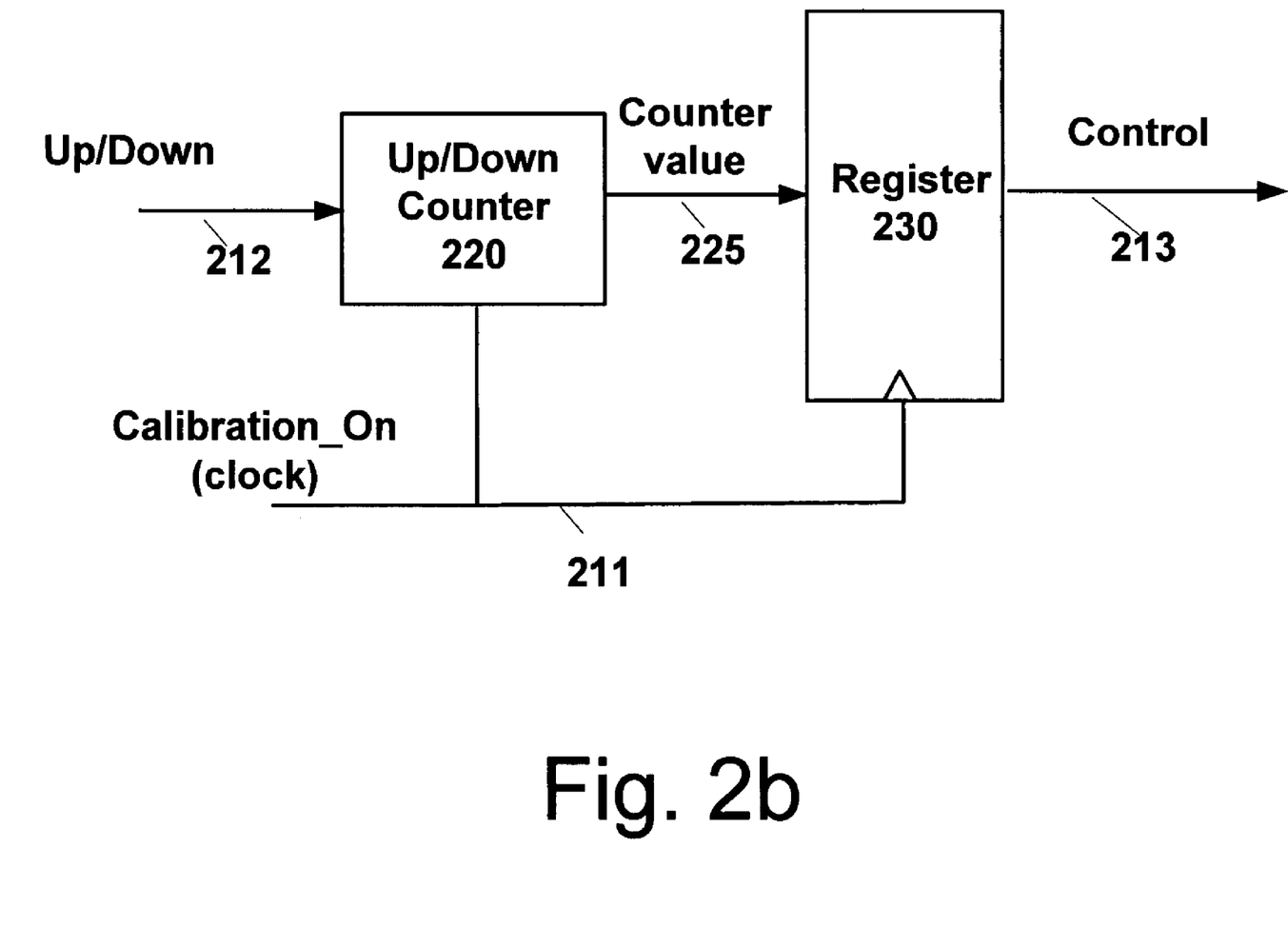

FIG. 2b illustrates an up/down register 204 shown in FIG. 2a including an up/down counter 220 coupled to signal line 212 that counts the number of up and down signals by way of incrementing or decrementing a counter value. A counter value is output from up/down counter 220 on signal line 225. Up/down register 204 also includes a register 230 having an input coupled signal line 225 that stores a counter value. Register 230 outputs a stored counter value as a control signal on line 213 to adjust variable resistor R2 and thus reference voltage $V_{REF}$ on signal line 210.

In an embodiment, system 200 includes a timing logic and timing control signal line similar to timing logic 121 and signal line 120 shown in FIG. 1 and described above.

Figure 3:
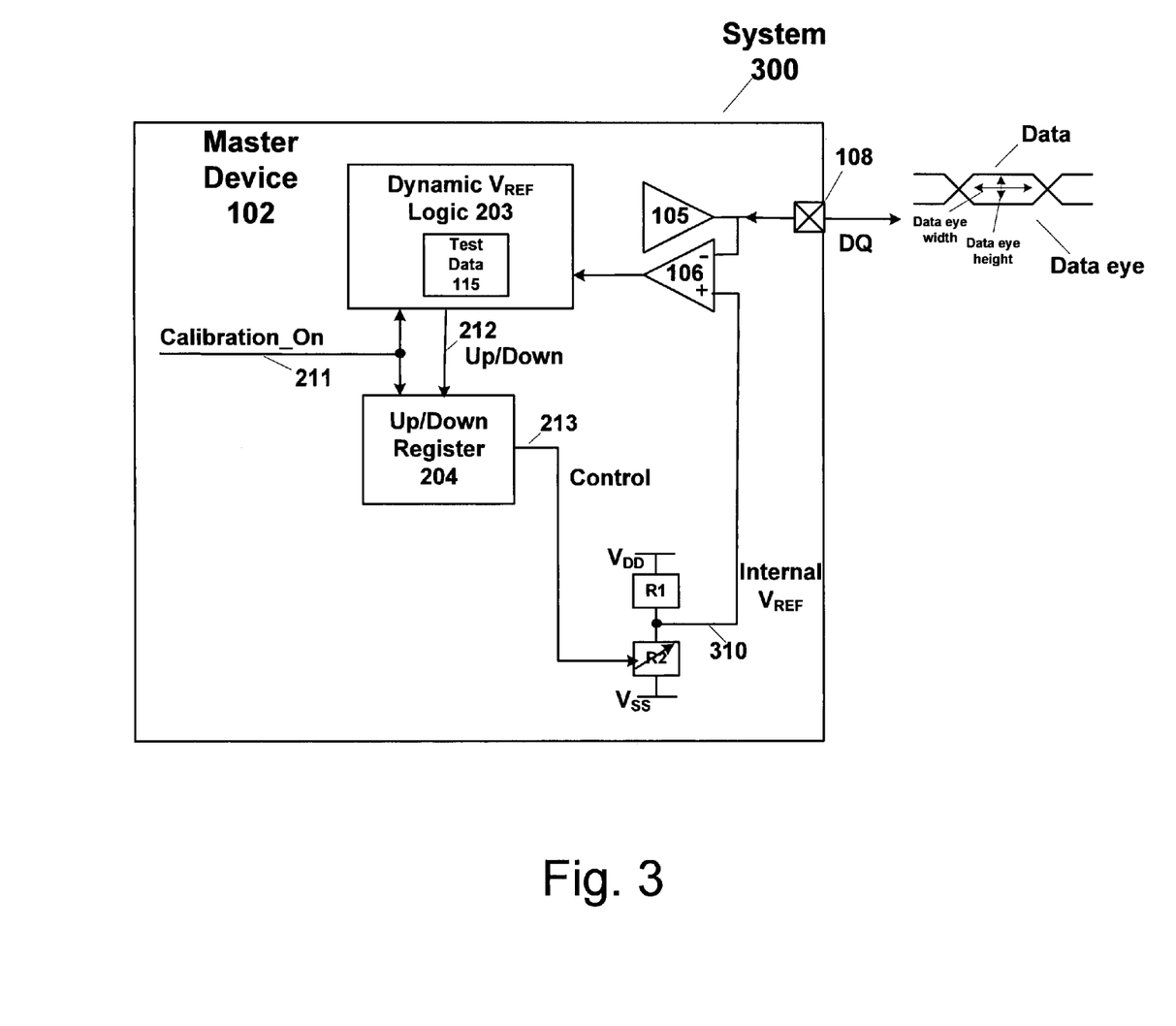
FIG. 3 illustrates a system 300 for adjusting a reference voltage $V_{REF}$ using a predetermined plurality of test data for a read operation according to an embodiment.

FIG. 3 illustrates a system 300 including a master device 102 for adjusting an internal reference voltage $V_{REF}$ on signal line 310 for a read operation. System 300 is similar to system 200 shown in FIG. 1 except that voltage sources $V_{DD}$ and $V_{SS}$ along with resistor R1 and variable resistor R2 are positioned in master device 102. A contact 108 is used to transmit and/or receive signals to or from one or more integrated circuit devices, such as between master device 102 and an integrated circuit memory device 603 as seen in FIG. 6. Contact 108 is coupled to integrated circuit memory devices by way of an interconnect DQ. An output of transmitter 105 and an input of receiver 106 are coupled to contact 108. Signal line 310 is also coupled to an input of receiver 106.

A Calibration_On signal, similar to system 200, is generated on signal line 211 in response to a system 300 operating in a $V_{REF}$ calibration or initialization mode. A Calibration_On signal is generated during a power-up of system 300 or during a periodic $V_{REF}$ calibration mode determined by master device 102 as described above. Dynamic $V_{REF}$ logic 203 outputs an up or down signal on signal line 212 responsive to comparing a plurality of received data signals at contact 108 with a predetermined plurality of test data 115 stored in Dynamic $V_{REF}$ logic 203 as described above in regard to system 200.

Up/down register 204 in system 300 operates similarly to up/down register 204 described above and illustrated in FIG. 2b.

In an embodiment, system 300 includes a timing logic and timing control signal line similar to timing logic 121 and signal line 120 shown in FIG. 1 and described above.

While embodiments illustrated and described herein show the use of resistors in providing a reference voltage $V_{REF}$, in alternate embodiments a digital-to-analog converter (DAC) provides a reference voltage $V_{REF}$ in response to a control signal generated in response to received data. In still further embodiments, an equivalent circuit is used to provide a reference voltage $V_{REF}$.

Figure 4:
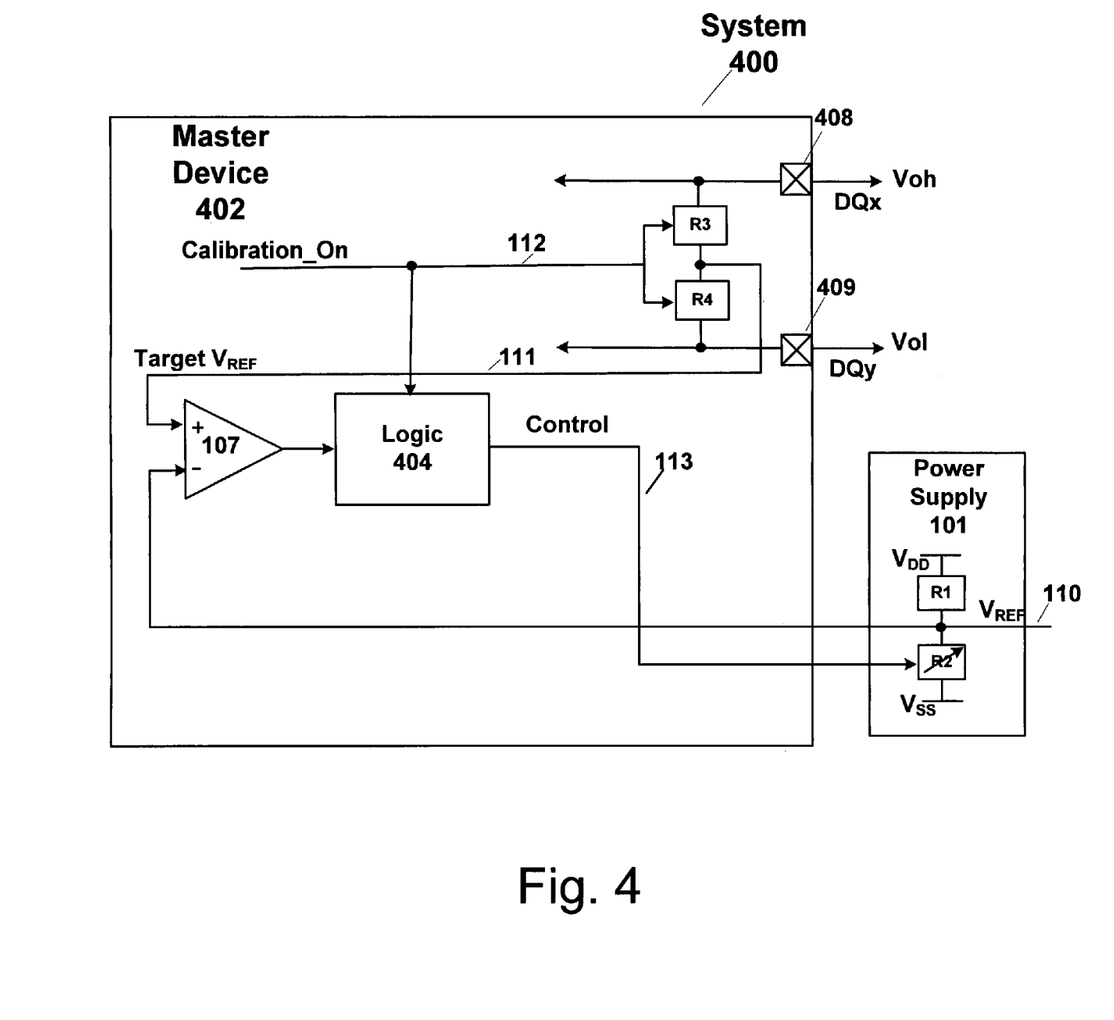
FIG. 4 illustrates a system 400 for adjusting a reference voltage $V_{REF}$ using voltages on a first and second contact for a write operation according to an embodiment.

FIG. 4 illustrates a system 400 including a master device 402 and a power supply 101 for adjusting an external reference voltage $V_{REF}$ on signal line 110 in response to first and second voltages on contacts 408 and 409 for a write or transmit operation. In embodiments, master device 402 is similar to master device 102 and may include a memory controller, general-purpose processor, graphics processor, set-top box processor, game console processor, television processor or an equivalent. In embodiments, power supply 101 is a separate integrated circuit device as illustrated in FIG. 4 or included in other system 400 circuit devices.

Contacts 408 and 409 are similar to contact 108 described above in regard to system 100. In particular, contacts 408 and 409 are used to transmit and/or receive signals to or from one or more integrated circuit devices, such as between master device 402 and integrated circuit memory device 603 as seen in FIG. 6. Interconnect DQ, as described above, includes a first signal line DQx to provide a voltage Voh (high voltage) at contact 408 and a second signal line DQy to provide a voltage Vol (low voltage) at contact 409.

System 400 includes a power supply 101 having two voltage sources $V_{DD}$ and $V_{SS}$ as well as resistor R1 and variable resistor R2 as described above in regard to system 100.

Also like system 100, system 400 includes a comparator 107 outputting a signal to logic 404 that provides a control signal on signal line 113 to adjust a resistance value of resistor R2 and therefore an external reference voltage $V_{REF}$ on signal line 110.

System 400 includes a Calibration_On signal provided on signal line 112 to logic 404 and resistors R3 and R4. A Calibration_On signal is generated in response to a system 400 operating in a $V_{REF}$ calibration or initialization mode. A Calibration_On signal is generated during a power-up of system 400 or during a periodic $V_{REF}$ calibration mode determined by master device 402 as described above. During a $V_{REF}$ calibration mode, a reference voltage $V_{REF}$ is adjusted to a Target reference voltage $V_{REF}$ output on signal line 111 to comparator 107. Resistors R3 and R4 provide a Target reference voltage $V_{REF}$ on signal line 111 in response to a Calibration_On signal on line 112. In an embodiment, resistors R3 and R4 are variable resistors that have predetermined respective resistance values responsive to a control word or signal in a Calibration _On signal.

Figure 5:
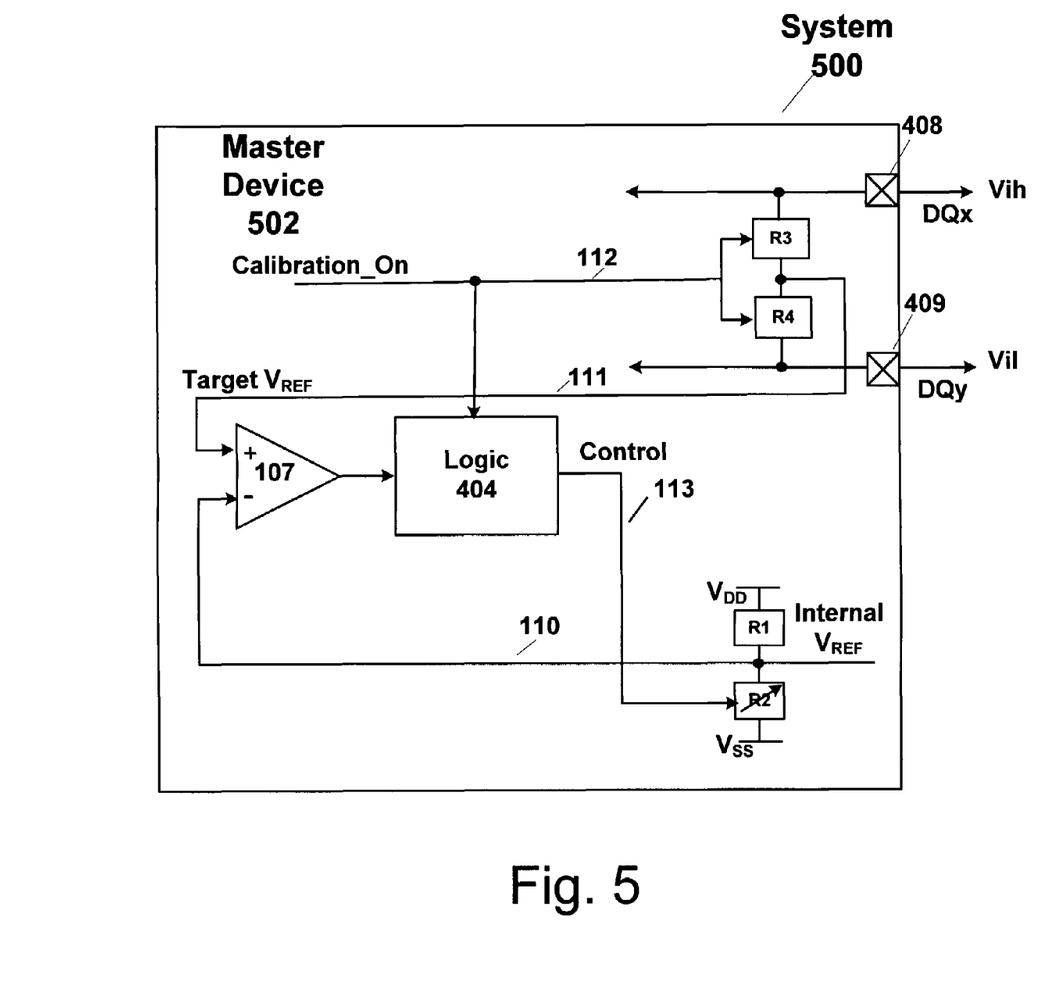
FIG. 5 illustrates a system 500 for adjusting a reference voltage $V_{REF}$ using voltages on a first and second contact for a read operation according to an embodiment.

FIG. 5 illustrates a system 500 including a master device 502 for adjusting an internal reference voltage $V_{REF}$ on signal line 110 in response to a first and second voltage on contacts 408 and 409 for a read operation. System 500 is similar to system 400 except that voltage sources $V_{DD}$ and $V_{SS}$ along with resistor R1 and variable resistor R2 are positioned in master device 502.

FIG. 6 illustrates a memory system 600 including a master device 601 coupled to N integrated circuit memory devices, such as memory devices 603–606 by interconnect DQ. A $V_{REF}$ power supply 610 provides an external reference voltage $V_{REF}$ to master device 601 and integrated circuit memory devices 603–606 on signal line 602. In an embodiment, master device 601 obtains respective calculated internal reference voltages $V_{REF}$ 601a (or specifically values representing a plurality of internal reference voltages $V_{REF}$) for read operations from a respective plurality of groups of integrated circuit memory devices on interconnect DQ. A stored value representing a calculated internal reference voltage $V_{REF}$ is selected and used to generate an internal reference voltage $V_{REF}$ when reading data signals on interconnect DQ from a particular integrated circuit memory device.

In an embodiment, values representing calculated internal reference voltages $V_{REF}$ 601a are calculated as described above. Master device 601 then stores respective values representing calculated internal reference voltages $V_{REF}$ 601a for respective groups and uses a selected value representing a calculated internal reference voltage $V_{REF}$ to provide an internal reference voltage $V_{REF}$ when master device 601 has a read operation from an integrated circuit memory device in a corresponding group of integrated circuit memory devices. For example, a plurality of counter values stored in one or more registers, similar to register 230 shown in FIG. 2b, are used by master device 601 to store counter values at a particular time that are used as calculated internal reference voltages $V_{REF}$.

In an alternate embodiment, a plurality of stored values representing respective internal reference voltages $V_{REF}$ are stored in a form of a look-up table in master device 601, or elsewhere on system 600. In this look-up embodiment, the plurality of stored values are not calculated by master device 601. A stored value is then selected from a look-up table by master device 601 and used by master device 601 during a read operation from a corresponding selected integrated circuit memory device or group of integrated circuit memory devices.

Master device 601 is similar to master devices 102, 402 and 502 as described above. In an embodiment, integrated circuit memory devices 603–606 each have a plurality of storage cells, collectively referred to as a memory array. An integrated circuit memory device stores data (which may be retrieved) associated with a particular address provided, for example, as part of a write or read command. In an embodiment of the present invention, a write or read command is included in a signal from master device 601. An integrated circuit memory device typically includes request decode and array access logic that, among other functions, decodes request and address information, and controls memory transfers between a memory array and an integrated circuit memory device interface circuit. In an embodiment of the present invention, read data from a memory array is output on interconnect DQ to master device 601.

Examples of types of integrated circuit memory devices include dynamic random access memory ("DRAM"), static random access memory ("SRAM"), double data rate SDRAM ("DDR"), DIRECT RAMBUS® memory ("DRDRAM"), "XDRTM" memory devices, Ferroelectric RAM ("FRAM"), Magnetoresistive or Magnetic RAM ("MRAM"), Flash, or read-only memory ("ROM").

In an embodiment, a plurality of integrated circuit memory devices is included in a plurality of groups. For example, a group of integrated circuit memory devices may be included in a memory module, such as a DIMM, that includes a package housing or structure having a plurality of memory devices employed with a connector interface. FIG. 6 illustrates integrated circuit memory devices 603 and 604 in a first group 1 and integrated circuit memory devices 605 and 606 in a second group N. Master device 601 then calculates internal reference voltages for groups of integrated circuit devices.

Figure 7:
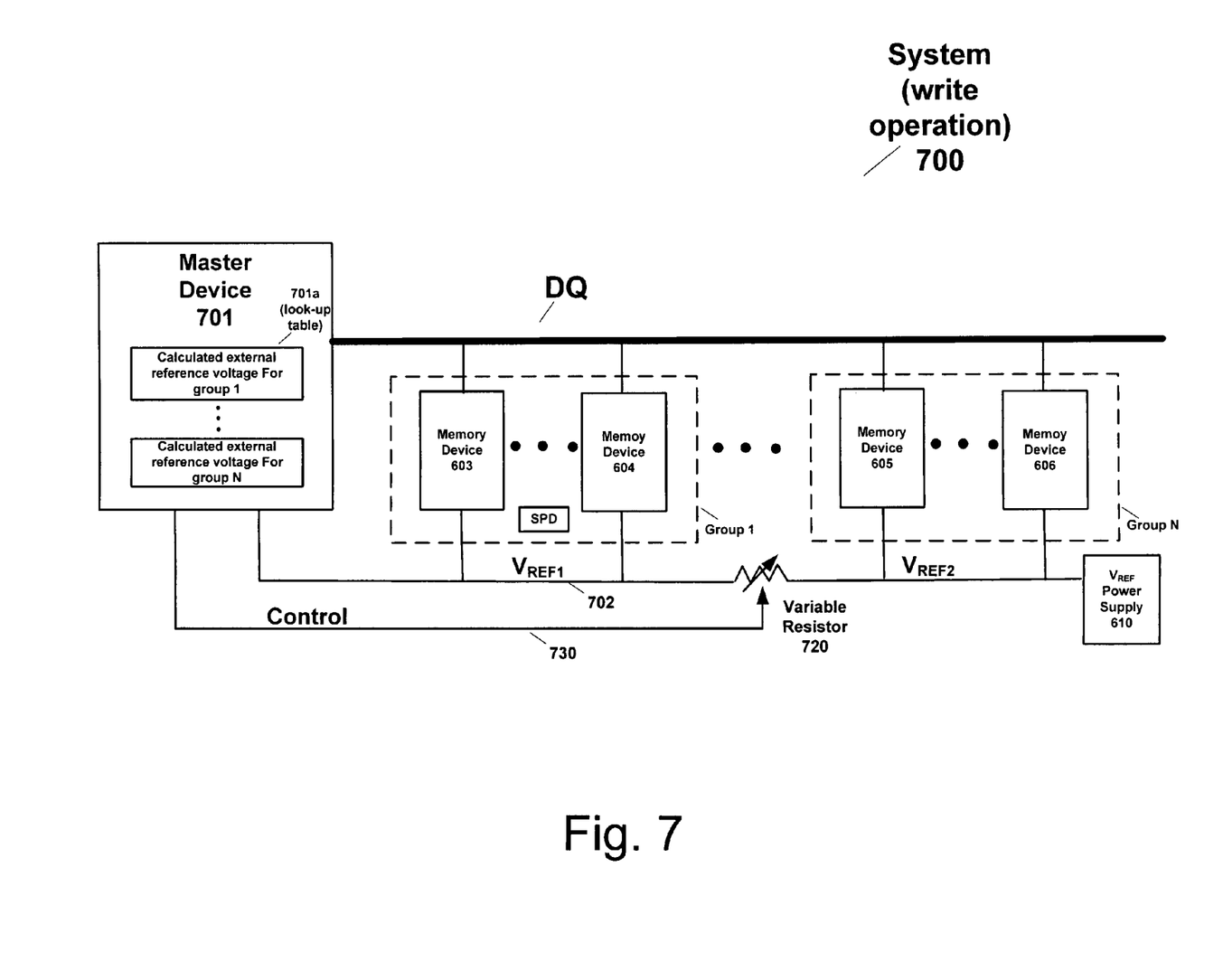
FIG. 7 illustrates a memory system 700 for using a plurality of respective calculated external reference voltages $V_{REF}$ for respective groups of integrated circuit memory devices in respective write operations according to an embodiment.

In an embodiment, information stored in a storage location on a memory module (for example, a serial presence detect (SPD) device), may be used to generate a Calibration On signal. For example, an SPD device may contain information that a memory device or controller device may use to configure a reference voltage level. In an embodiment, an SPD device is a non-volatile memory device that may be positioned on a memory module, such as a dual inline memory module (DIMM), or elsewhere in system 600 or 700 embodiments. The SPD device stores information used by system 600 to properly configure system 600. For example, an SPD may include information regarding memory module population topology or rank, if any.

In an embodiment, system 600 reads information from an SPD device. That information may be used to program a register located on a master device 601 to store a value that represents a desired mode. The register that stores the value can be used to generate a Calibration_On for the memory device signal in an embodiment.

In an alternate embodiment, system 600 reads an SPD device to determine the memory module population topology (or number and position of integrated circuit memory devices for a particular memory module) or rank, if any. Based on this read information, master device 601 selects a stored value representing a particular internal reference voltage $V_{REF}$ to be used to generate a particular internal reference voltage $V_{REF}$ value. The stored value may be stored in master device 601 or elsewhere in system 600. The selected internal reference voltage $V_{REF}$ is generated by master device 601 during a read operation from the particular memory module, group of memory modules or selected integrated circuit memory devices in a particular memory module associated or identified by the information in the SPD.

FIG. 7 illustrates a memory system 700 for adjusting external reference voltages $V_{REF}$ provided on signal line 702 to a plurality of integrated circuit memory devices 603–606 during write operations to particular integrated circuit memory devices. System 700 is similar to system 600 in that master device 701 is coupled to groups of integrated circuit memory devices by interconnect DQ and a $V_{REF}$ power supply 610 by signal line 702. Master device 701 also stores and/or calculates values representing external reference voltages $V_{REF}$ 701a associated with one or more integrated circuit memory devices. Values representing external reference voltages $V_{REF}$ 701a are calculated and stored similarly to values representing internal reference voltages $V_{REF}$ 601a shown in FIG. 6 and described above. For example, values representing external reference voltages $V_{REF}$ 701a may be calculated as illustrated in FIGS. 1, 2a–b and 4. Alternatively, values representing external reference voltages $V_{REF}$ 701a may be stored in a look-up table or used in conjunction with an SPD device as described above.

When master device 701 writes to a particular integrated circuit memory device or memory module, a particular value in values representing external reference voltages $V_{REF}$ 701a is selected (and/or calculated) and used to output a control signal on control signal line 730 to one or more variable resistors 720 coupled in series to signal line 702. Based on one or more control signals provided to one or more variable resistors 720, various external reference voltages (for example, $V_{REF1}$ having a first voltage value for integrated circuit memory devices 603–604 and $V_{REF2}$ having a second different voltage value for integrated circuit memory devices 605–606) are provided to respective integrated circuit memory devices during a write operation of master device 701 to the respective integrated circuit memory devices. For example, when write signals are generated by master device 701 to integrated circuit memory device 603 on interconnect DQ, master device 701 calculates and/or selects a particular value representing an external reference voltage value (for example, reference voltage $V_{REF1}$) in order to generate a control signal on signal line 730 to variable resistor 720 such that reference voltage $V_{REF1}$ is provided on signal line 702 at integrated circuit memory device 603 when master device 701 is writing data to integrated circuit memory device 603 on interconnect DQ.

A memory system 700 uses variable resistors 720 controlled by master device 701 to compute the selected resistor values to improve system performance or decrease errors in data transmission and reception.

In embodiments, calculating, storing, selecting and providing of values representing internal and external reference voltages $V_{REF}$ shown in FIGS. 6 and 7 may be combined, singly or in combination.

Figure 8:
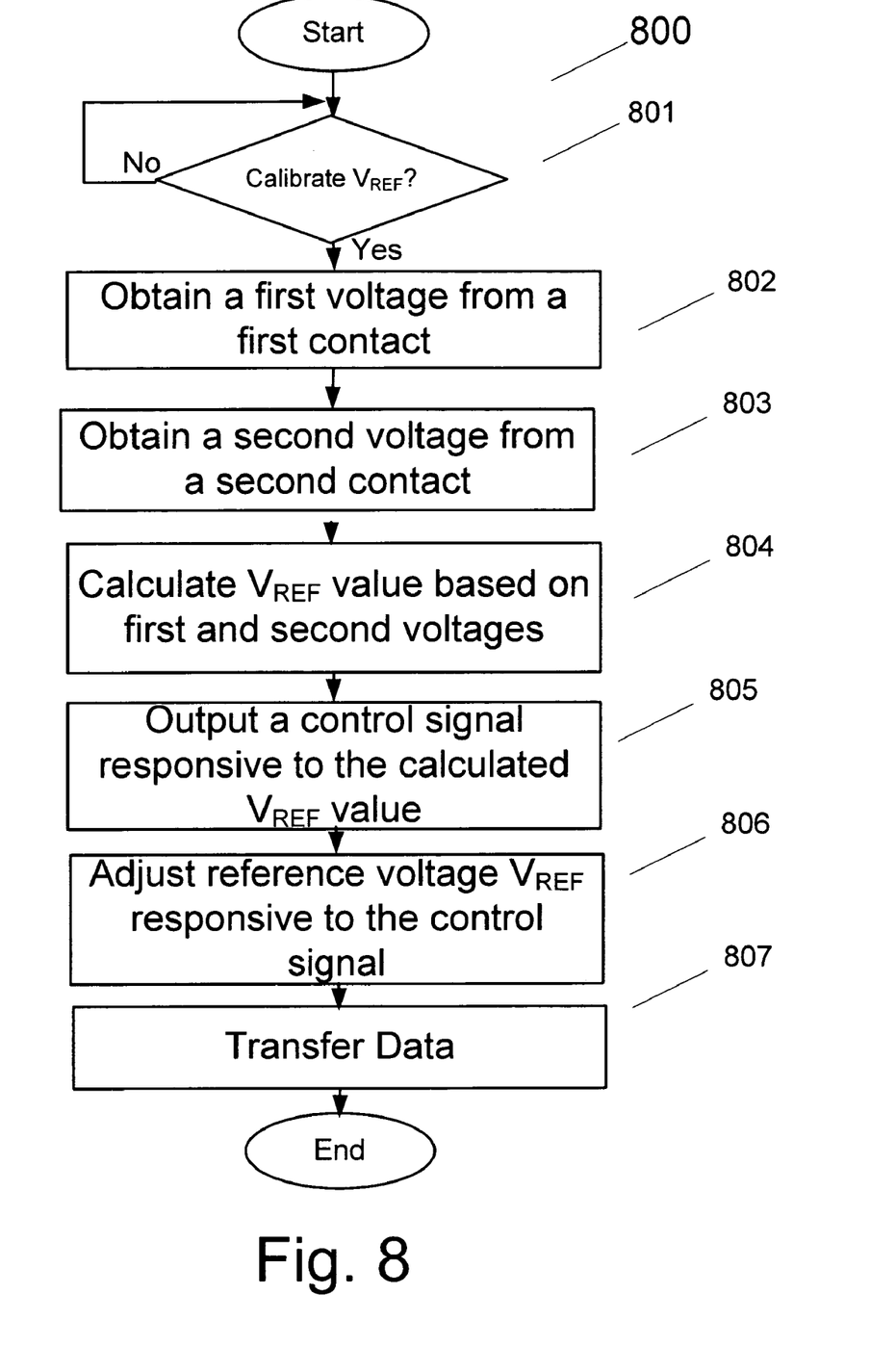
FIG. 8 illustrates a method 800 for providing a reference voltage $V_{REF}$ responsive to a first and second voltage at a first and second contact, respectively, according to an embodiment of the present invention.
Figure 9:
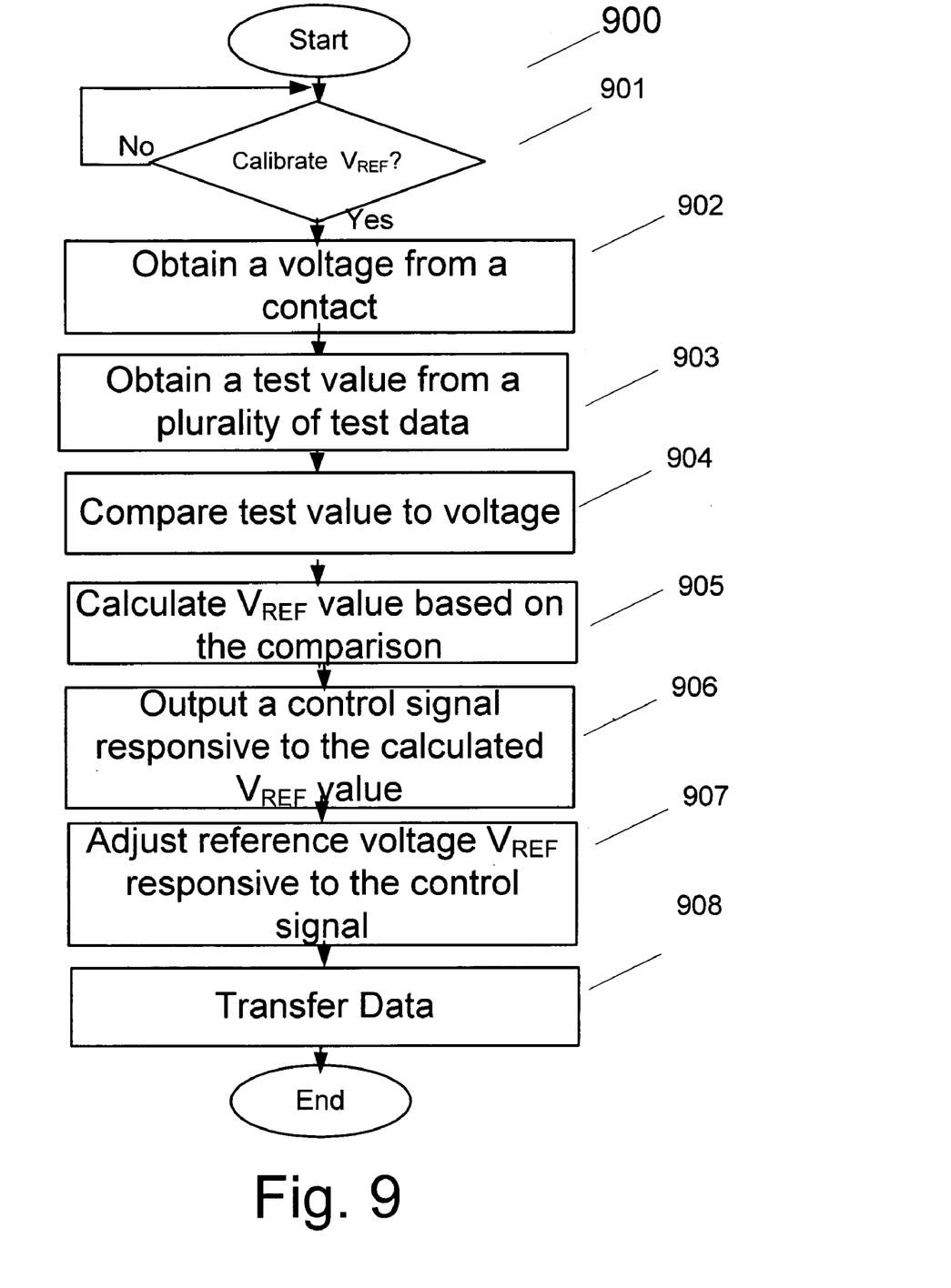
FIG. 9 illustrates a method 900 for providing a reference voltage $V_{REF}$ responsive to a first voltage at a first contact and a test value in a predetermined plurality of test data according to an embodiment of the present invention.
Figure 10:
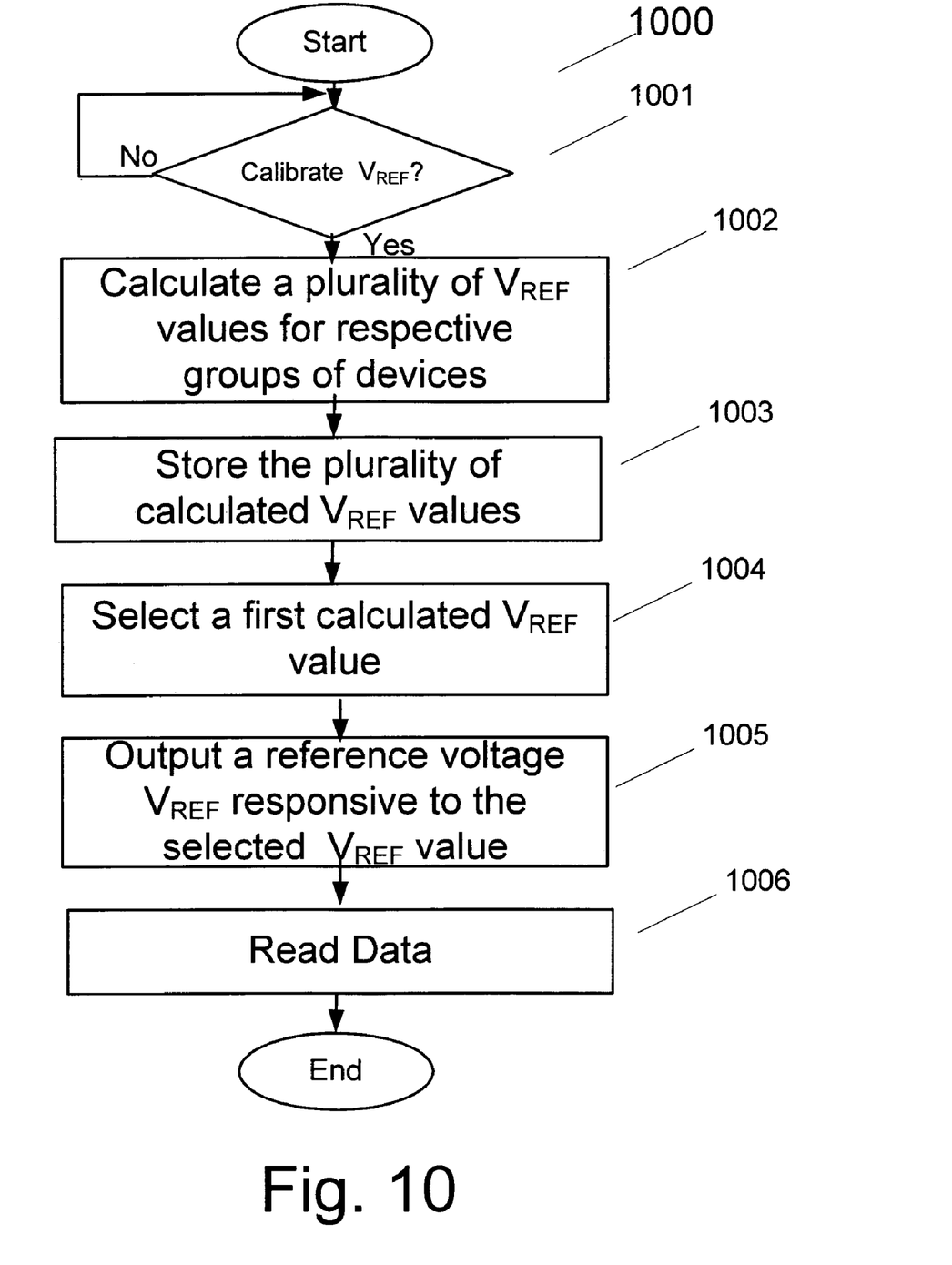
FIG. 10 illustrates a method 1000 for providing a plurality of respective internal reference voltages $V_{REF}$ for respective groups of integrated circuit memory devices during respective read operations according to an embodiment.

FIGS. 8–10 illustrate method embodiments 800, 900 and 1000 for adjusting a reference voltage $V_{REF}$ during a write or read operation. In alternate embodiments of the present invention, steps or logic blocks illustrated in FIGS. 8–10 are carried out by hardware, software or a combination thereof. In alternate embodiments, the circuit devices illustrated in FIGS. 1–7 carry out the steps illustrated in FIGS. 8–10. As one of ordinary skill in the art would appreciate, other steps that are not shown may be included in various embodiments of the present invention. Also, while methods 800, 900 and 1000 are described in sequential steps, one of ordinary skill in the art would appreciate that method steps or logic blocks of methods 800, 900 and 1000 are completed very quickly or almost instantaneously.

FIG. 8 illustrates a method 800 that begins at logic block 801 where a determination is made whether to calibrate a reference voltage $V_{REF}$. In an embodiment, the determination is made during an initialization or power-up mode, or alternatively during a periodic calibration mode determined by a master device, in particular control software of a master device. If a reference voltage $V_{REF}$ is to be calibrated, control transitions to logic block 802 where a first voltage is obtained from a first contact, such as a memory controller pin. In logic block 803, a second voltage is obtained from a second contact. A Target reference voltage $V_{REF}$ is then calculated based on the first and second measured voltages in logic block 804. In an embodiment, this calculation is performed by master device 402 and in particular at least in part by logic 404 as illustrated by FIGS. 4 and 5. A control signal is then output to adjust reference voltage $V_{REF}$ based on the calculations as shown by logic block 805. Reference voltage $V_{REF}$ is then adjusted as illustrated by logic block 806 and data is transferred using the calibrated reference voltage $V_{REF}$ as shown by logic block 807. In an embodiment, data is written to an integrated circuit memory device using the calibrated external reference voltage $V_{REF}$. Method 800 then ends.

FIG. 9 illustrates a method 900 that begins at logic block 901 where a determination is made whether to calibrate a reference voltage $V_{REF}$. In an embodiment, the determination is made during an initialization or power-up mode, or alternatively during a periodic calibration mode determined by a master device, in particular control software of a master device. If reference voltage $V_{REF}$ is to be calibrated, control transitions to logic block 902 where a measured voltage is obtained from a contact, such as a memory controller pin. In logic block 903, a test value is obtained from a plurality of test values, such as a PRBS stored in a master device. A measured voltage is then compared to a test value as shown in logic block 904. In an embodiment, multiple voltage values are obtained from a contact and compared with a plurality of test values. A calculated reference voltage $V_{REF}$ is then calculated based on the comparison of the measured voltages with a stored test value or a plurality of test values in logic block 905. In an embodiment, a calculation is performed by master device 102 and in particular at least in part by Dynamic $V_{REF}$ logic 103, logic 104, or up/down register 204 as illustrated by FIGS. 1, 2a–b and 3. A control signal is then output to adjust reference voltage $V_{REF}$ based on the calculations as shown by logic block 906. Reference voltage $V_{REF}$ is then calibrated as illustrated by logic block 907 and data is transferred using the calibrated reference voltage $V_{REF}$ as shown by logic block 908. In an embodiment, data is written to or read from an integrated circuit memory device by a master device using a calibrated internal or external reference voltage $V_{REF}$. Method 900 then ends.

FIG. 10 illustrates a method 1000 that begins at logic block 1001 where a determination is made whether to calibrate a plurality of reference voltages $V_{REF}$. In an embodiment, the determination is made during an initialization or power-up mode, or alternatively during a periodic calibration mode determined by a master device, in particular control software of a master device. If a plurality of reference voltages $V_{REF}$ is to be calibrated, control transitions to logic block 1002 where a plurality of calculated reference voltages $V_{REF}$ are calculated as described in various embodiments described above. In an embodiment, master device 601 as described above, calculates a respective plurality of reference voltage $V_{REF}$ values for a plurality of groups of integrated circuit memory devices. In an embodiment, a group of integrated circuit memory devices include one or more integrated circuit memory devices, such as a memory module. A plurality of calculated reference voltage $V_{REF}$ values are then stored as illustrated in logic block 1003. In an embodiment, a plurality of calculated reference voltages $V_{REF}$ are stored in memory of master device 601. A first calculated reference voltage $V_{REF}$ is then selected depending upon an operation to be performed by a master device, such as a read or write operation, from or to a selected group of integrated circuit memory devices as shown by logic block 1004. An internal (or external) reference voltage $V_{REF}$ is then output in response to the selected and calculated reference voltage $V_{REF}$ as shown by logic block 1005. A read operation, using the selected reference voltage $V_{REF}$, to a group of integrated circuit memory devices is then performed by a master device as illustrated by logic block 1006. Method 1000 then ends.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit, comprising:
   a first contact to receive a first voltage;
   a first variable resistor, coupled to the first contact, to provide a variable resistance in response to a calibration signal;
   a second contact to receive a second voltage;
   a second variable resistor, coupled to the second contact and coupled to the first variable resistor at a node, to provide a variable resistance in response to the calibration signal, wherein a third voltage representing a target reference voltage is provided at the node in response to the first and second voltages and the first and second variable resistances;
   a comparator to compare the third voltage and a reference voltage, the comparator to output a difference signal; and
   logic to provide a control signal indicating an adjustment to the reference voltage in response to the difference signal.

2. The integrated circuit of claim 1, further comprising:
   a digital-to-analog converter to provide the reference voltage in response to the control signal.

3. The integrated circuit of claim 1, further comprising:
   a first voltage source coupled to a resistor;
   a second voltage source coupled to a third variable resistor to provide a resistance in response to the control signal; and
   a first signal path coupled to the resistor and the third variable resistor to provide the reference voltage.

4. The integrated circuit of claim 3, wherein the first voltage source is a high potential voltage source and the second voltage source is a low potential voltage source.

5. The integrated circuit of claim 3, further comprising:
   a second signal path, coupled to the first and second variable resistors, to provide the third voltage; and
   wherein the comparator is coupled to the first and second signal paths.

6. The integrated circuit of claim 3, wherein the first and second contacts are pins on a memory controller used for transferring write data and at least a portion of the first signal path is external to the memory controller.

7. The integrated circuit of claim 3, wherein the first and second contacts are pins on a memory controller used for transferring read data and at least a portion of the first signal path is internal to the memory controller.

8. The integrated circuit of claim 1, wherein the reference voltage is provided during a calibration mode.

9. The integrated circuit of claim 1, wherein the reference voltage is provided during an initialization mode.

10. An integrated circuit, comprising:
    a first contact to receive a plurality of voltage values;
    a storage circuit to store a plurality of test values;
    logic, coupled to the first contact, to provide an adjustment signal in response to a comparison of a test value in the plurality of test values and a voltage value in the plurality of voltage values; and
    a register, coupled to the logic, to output a control signal indicating an adjustment to a reference voltage in response to the adjustment signal.

11. The integrated circuit of claim 10, further comprising:
a digital-to-analog converter to provide the reference voltage in response to the control signal.

12. The integrated circuit of claim 10, further comprising:
a first voltage source coupled to a resistor;
a second voltage source coupled to a variable resistor to provide a resistance in response to the control signal; and
a first signal path coupled to the resistor and the variable resistor to provide the reference voltage.

13. The integrated circuit of claim 12, wherein the first contact is a pin on a memory controller used for transferring read data and the first signal path is internal to the memory controller.

14. The integrated circuit of claim 12, wherein the first voltage source is a high potential voltage source and the second voltage source is a low potential voltage source.

15. The integrated circuit of claim 10, wherein the reference voltage is provided during a calibration mode.

16. The integrated circuit of claim 10, wherein the reference voltage is provided during an initialization mode.

17. An integrated circuit, comprising:
a first contact to provide a plurality of voltage values;
a storage circuit to store a plurality of test values;
logic, coupled to the first contact, to provide an adjustment signal in response to a comparison of a test value in the plurality of test values and a voltage value in the plurality of voltage values; and
a register, coupled to the logic, to output a control signal indicating an adjustment to a reference voltage in response to the adjustment signal,
wherein the reference voltage is adjusted external to the integrated circuit.

18. The integrated circuit of claim 17, further comprising:
a digital-to-analog converter to provide the reference voltage in response to the control signal.

19. The integrated circuit of claim 17, further comprising:
a first voltage source coupled to a resistor;
a second voltage source coupled to a variable resistor to provide a resistance in response to the control signal; and
a first signal path coupled to the resistor and the variable resistor to provide the reference voltage.

20. The integrated circuit of claim 19, wherein the first voltage source is a high potential voltage source and the second voltage source is a low potential voltage source.

21. The integrated circuit of claim 19, wherein the reference voltage includes a first reference voltage used for address values and a second reference voltage used for data values.

22. The integrated circuit of claim 19, wherein the first contact is a pin on a memory controller used for transferring write data and the first signal path is external to the memory controller.

23. Computer-readable media to store computer executable instructions that provide information representing a circuit, the represented circuit comprising:
a first contact to receive a plurality of voltage values;
a storage circuit to store a plurality of test values;
logic, coupled to the first contact, to provide an adjustment signal in response to a comparison of a test value in the plurality of test values and a voltage value in the plurality of voltage values; and
a register, coupled to the logic, to output a control signal indicating an adjustment to a reference voltage in response to the adjustment signal.

* * * * *